United States Patent
Li et al.

(10) Patent No.: US 8,059,454 B2
(45) Date of Patent: Nov. 15, 2011

(54) ADJUSTABLE WRITE PULSE GENERATOR WITHIN A CHALCOGENIDE MEMORY DEVICE

(75) Inventors: Bin Li, Chantilly, VA (US); Adam Matthew Bumgarner, Duluth, GA (US); Daniel Pirkl, Centreville, VA (US); George Michael, High Point, NC (US)

(73) Assignees: BAE Systems Information and Electronic Systems Integration Inc., Nashua, NH (US); Ovonyx, Inc., Rochester Hills, MI (US)

( * ) Notice: Subject to any disclaimer, the term of this patent is extended or adjusted under 35 U.S.C. 154(b) by 192 days.

(21) Appl. No.: 12/531,851

(22) PCT Filed: Dec. 1, 2008

(86) PCT No.: PCT/US2008/085176
§ 371 (c)(1),
(2), (4) Date: Jan. 11, 2010

(87) PCT Pub. No.: WO2009/070804
PCT Pub. Date: Jun. 4, 2009

(65) Prior Publication Data
US 2010/0135070 A1    Jun. 3, 2010

Related U.S. Application Data

(60) Provisional application No. 60/991,421, filed on Nov. 30, 2007.

(51) Int. Cl.
*G11C 7/00* (2006.01)

(52) U.S. Cl. .......... 365/163; 365/189.16; 365/210
(58) Field of Classification Search .......... 365/163, 365/210, 233, 189.16
See application file for complete search history.

(56) References Cited

U.S. PATENT DOCUMENTS

| 7,250,821 | B2* | 7/2007 | Momii et al. .......... 331/1 A |
| 7,262,990 | B2* | 8/2007 | Cho et al. .......... 365/163 |
| 2004/0051094 | A1 | 3/2004 | Ooishi |
| 2005/0013205 | A1 | 1/2005 | Brooks et al. |
| 2007/0158634 | A1 | 7/2007 | Ooishi |

* cited by examiner

*Primary Examiner* — Son Dinh
(74) *Attorney, Agent, or Firm* — Yudell Isidore Ng Russell PLLC; Antony Ng

(57) ABSTRACT

An adjustable write pulse generator is disclosed. The adjustable write pulse generator includes a band-gap reference current, a programmable ring oscillator, a frequency divider and a single pulse generator. The band-gap reference current circuit generates a well-compensated current over a predetermined range of temperatures needed to program a chalcogenide memory cell. The programmable ring oscillator generates a first set of continuous write "0" and write "1" pulse signals based on the well-compensated current. The frequency divider then divides the first set of continuous write "0" and write "1" pulse signals into a second set of continuous write "0" and write "1" pulse signals. The single pulse generator subsequently converts the second set of continuous write "0" and write "1" pulse signals into a single write "0" pulse signal or a single write "1" pulse signal when programming the chalcogenide memory cell.

5 Claims, 3 Drawing Sheets

ADJUSTABLE WRITE PULSE GENERATOR WITHIN A CHALCOGENIDE MEMORY DEVICE

PRIORITY CLAIM

The present application claims benefit of priority under 35 U.S.C. §365 to the previously filed international patent application number PCT/US2008/085176 filed on Dec. 1, 2008, assigned to the assignee of the present application, and having a priority date of Nov. 30, 2007, based upon U.S. provisional patent application No. 60/991,421. The contents of both applications are incorporated herein by reference.

STATEMENT OF GOVERNMENT INTEREST

The present invention was made with United States Government assistance under Contract No. FA9453-04-C-0052 awarded by the United States Air Force. The United States Government has certain rights in the present invention.

BACKGROUND OF THE INVENTION

1. Technical Field

The present invention relates to memory devices in general, and in particular to an adjustable write pulse generator within a chalcogenide memory device.

2. Description of Related Art

Phase transformation is a process of changing a phase change material from an amorphous state into a crystalline state or vice versa. Such phase transformation generally occurs when an electrical field is being applied to a phase change material. Because the amorphous state of the phase change material has a different electrical resistance from the crystalline state of the phase change material, the two different states can be utilized to represent a logical "0" and a logical "1," respectively, for data storage applications.

An alloy known as chalcogenide, which includes germanium, antimony and tellurium, can be made to have phase transformation properties at a relatively low voltage. The electrical properties of chalcogenide are also particularly suitable for data storage applications. Since random access memories made of chalcogenide can easily be integrated with conventional logic circuits, chalcogenide random access memories have gradually become one of the more promising technologies for producing a new generation of memory devices, especially for light portable electronic devices.

SUMMARY OF THE INVENTION

In accordance with a preferred embodiment of the present invention, an adjustable write pulse generator includes a band-gap reference current, a programmable ring oscillator, a frequency divider and a single pulse generator. The band-gap reference current circuit generates a well-compensated current over a predetermined range of temperatures needed to program a chalcogenide memory cell. The programmable ring oscillator generates a first set of continuous write "0" and write "1" pulse signals based on the well-compensated current. The frequency divider then divides the first set of continuous write "0" and write "1" pulse signals into a second set of continuous write "0" and write "1" pulse signals. The single pulse generator subsequently converts the second set of continuous write "0" and write "1" pulse signals into a single write "0" pulse signal or a single write "1" pulse signal when programming the chalcogenide memory cell.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
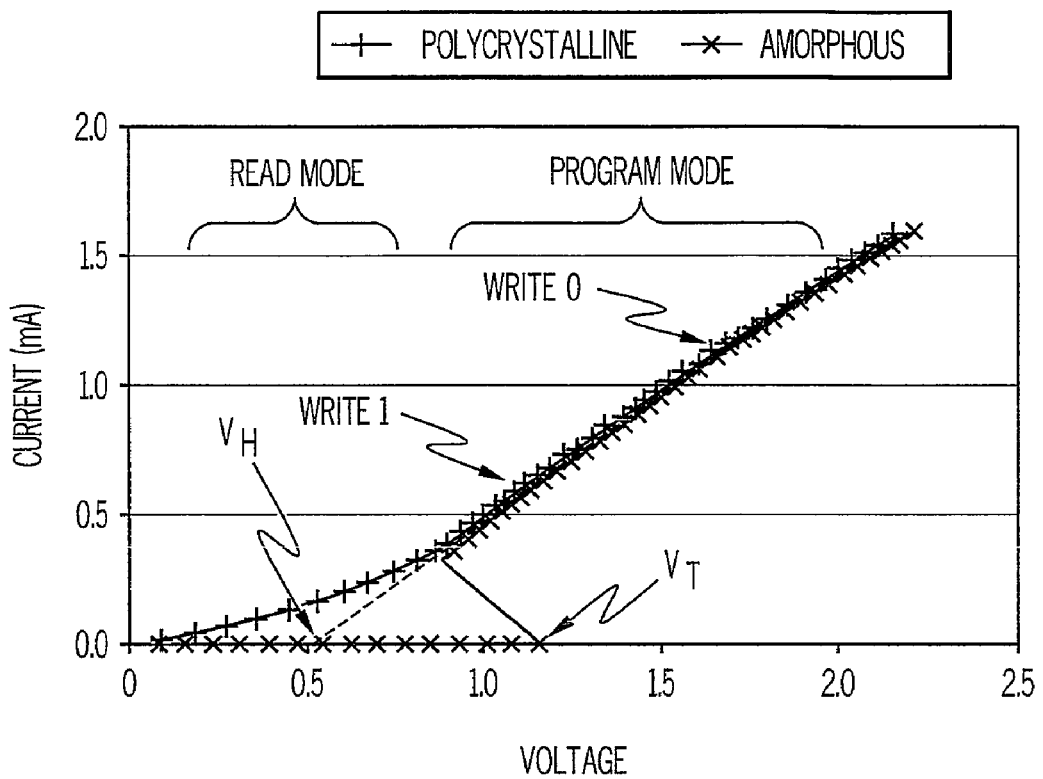
FIG. 1A is a current-voltage curve of a chalcogenide memory cell.

Referring now to the drawings and in particular to FIG. 1A, there is illustrated a current-voltage curve of a chalcogenide memory cell as the chalcogenide memory cell is being programmed and read. As shown, the chalcogenide material in the chalcogenide memory cell behaves like a quasi-linear resistor in a polycrystalline state, and the chalcogenide material exhibits a voltage snap-back at approximately a threshold voltage $V_T$ in an amorphous state.

The chalcogenide memory cell can be placed in a read mode when the applied voltage to the chalcogenide material within the chalcogenide memory cell is lower than the threshold voltage $V_T$. Conversely, the chalcogenide memory cell can be placed in a program (or write) mode when the applied voltage to chalcogenide material within the chalcogenide memory cell is higher than the threshold voltage $V_T$.

Figure 1B:
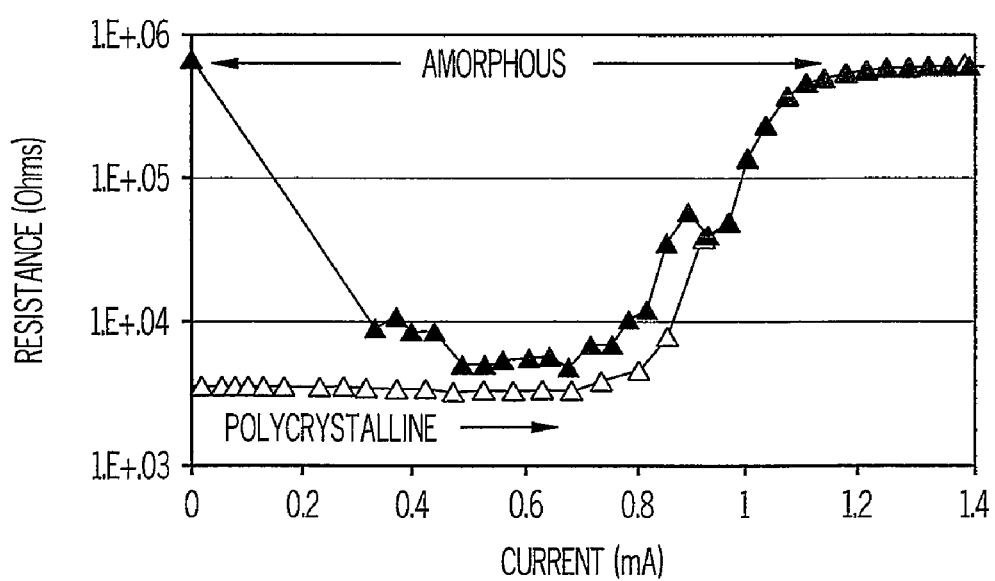
FIG. 1B is a resistance-current curve of a chalcogenide memory cell.

During the program mode, the chalcogenide memory cell can be programmed to either a low-resistance state (i.e., a logical "1" or set) or a high-resistance state (i.e., a logical "0" or reset) by utilizing different write current amplitude to heat the chalcogenide material within the chalcogenide memory cell to either the polycrystalline state or the amorphous state, respectively, as shown in FIG. 1B.

Writing a logical "1" requires a lower current amplitude and a relatively long cooling time. In contrast, writing a logical "0" requires a higher current amplitude and a much shorter cooling time.

An extrapolation of the linear region of the current-voltage curve in FIG. 1A to the x-axis yields a point known as a holding voltage $V_H$. In order to exit the program mode, the applied voltage to the chalcogenide memory cell must be less than the holding voltage $V_H$.

When programming a chalcogenide memory device, it is critical to have an accurate distribution of write current with the correct amplitude in order to ensure uniform programming of all chalcogenide memory cells within the chalcogenide memory device. The read and write current networks are preferably separated within the chalcogenide memory device in order to allow independent trim controls and to prevent noise coupling from one operation to another.

Because of the importance of providing precise write current amplitude to chalcogenide memory cells, multiple control options are required within a chalcogenide memory device. In the present embodiment, an adjustable write pulse generator is utilized to generate multiple timing control signals, and a write circuit is utilized to generate write signals for programming chalcogenide memory cells, based on the timing control signals from the adjustable write pulse generator.

Figure 2:
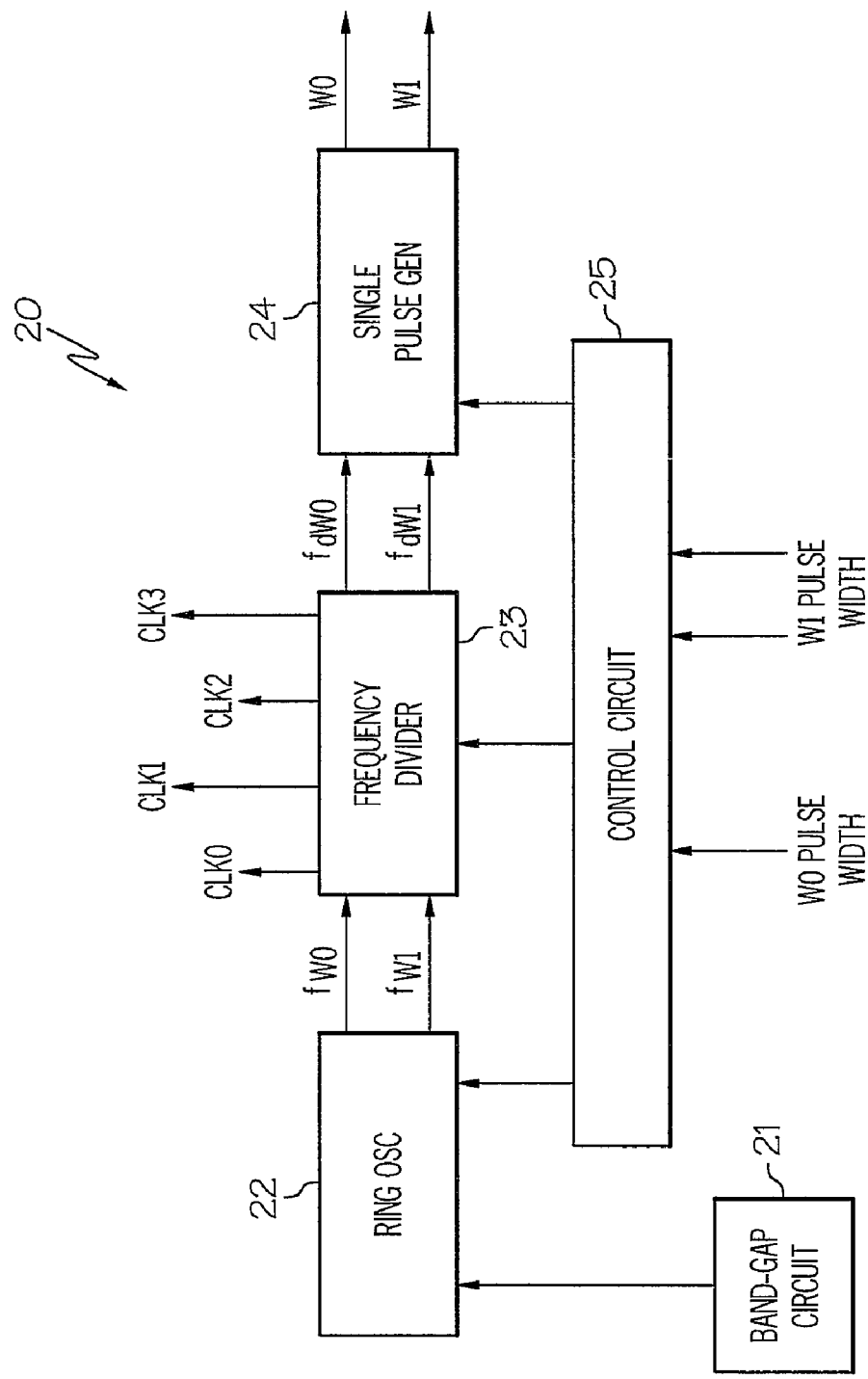
FIG. 2 is a block diagram of an adjustable write pulse generator, in accordance with a preferred embodiment of the present invention.

With reference now to FIG. 2, there is depicted a block diagram of an adjustable write pulse generator, in accordance with a preferred embodiment of the present invention. As shown, an adjustable write pulse generator 20 includes a band-gap reference current circuit 21, a programmable ring oscillator 22, a frequency divider 23, a single pulse generator 24 and a control circuit 25. Band-gap reference current circuit 21 generates a well-compensated current over a range of temperatures and supply voltages specifically designed for controlling the oscillation frequency of programmable ring oscillator 22 over a given temperature range. In addition to pulse duration and shape, the amplitude of write pulses allows the proper energy needed to program chalcogenide memory cells.

A series Write "0" (W0) pulse signals (i.e., $f_{W0}$) and write "1" (W1) pulse signals (i.e., $f_{W1}$) are separately transmitted from programmable ring oscillator 22 to frequency divider 23. The output clock of programmable ring oscillator 22 can be adjusted by input pins (not shown) based upon specific chalcogenide cell technology. Frequency divider 23 in turn converts $f_{W0}$ and $f_{W1}$ signals to $f_{dW0}$ and $f_{dW1}$ signals, respectively, and the $f_{dW0}$ and $f_{dW1}$ signals are then transmitted to single pulse generator 24. Single pulse generator 24 provides a single W0 pulse signal and/or a single W1 pulse signal of various pulse width according to control circuit 25.

Control circuit 25 controls the duration, shape, and type of write pulse signals based on inputs such as a W0 pulse width input and a W1 pulse width input. For the present embodiment, the one-digit W0 pulse width input allows a W0 single pulse signal to be selected between two different pulse widths, e.g., a 60 ns pulse width and a 120 ns pulse width. The two-digit W1 pulse width input allows a W1 single pulse signal to be selected among four different pulse widths, e.g., a 250 ns pulse width, a 500 ns pulse width, a 750 ns pulse width and a 1600 ns pulse width. The selectable W0 and W1 pulse width inputs allow discrete step calibration to satisfy the required pulse duration based on the energy requirement of a specific chalcogenide cell technology.

Under the control of control circuit 25, single pulse generator 24 generates a single pulse signal for both write polarities to provide timing information to various write circuits. The single W0 pulse signal and/or a single W1 pulse signal from single pulse generator 24 are subsequently sent to a write head within a write circuit shown in FIG. 3.

Figure 3:
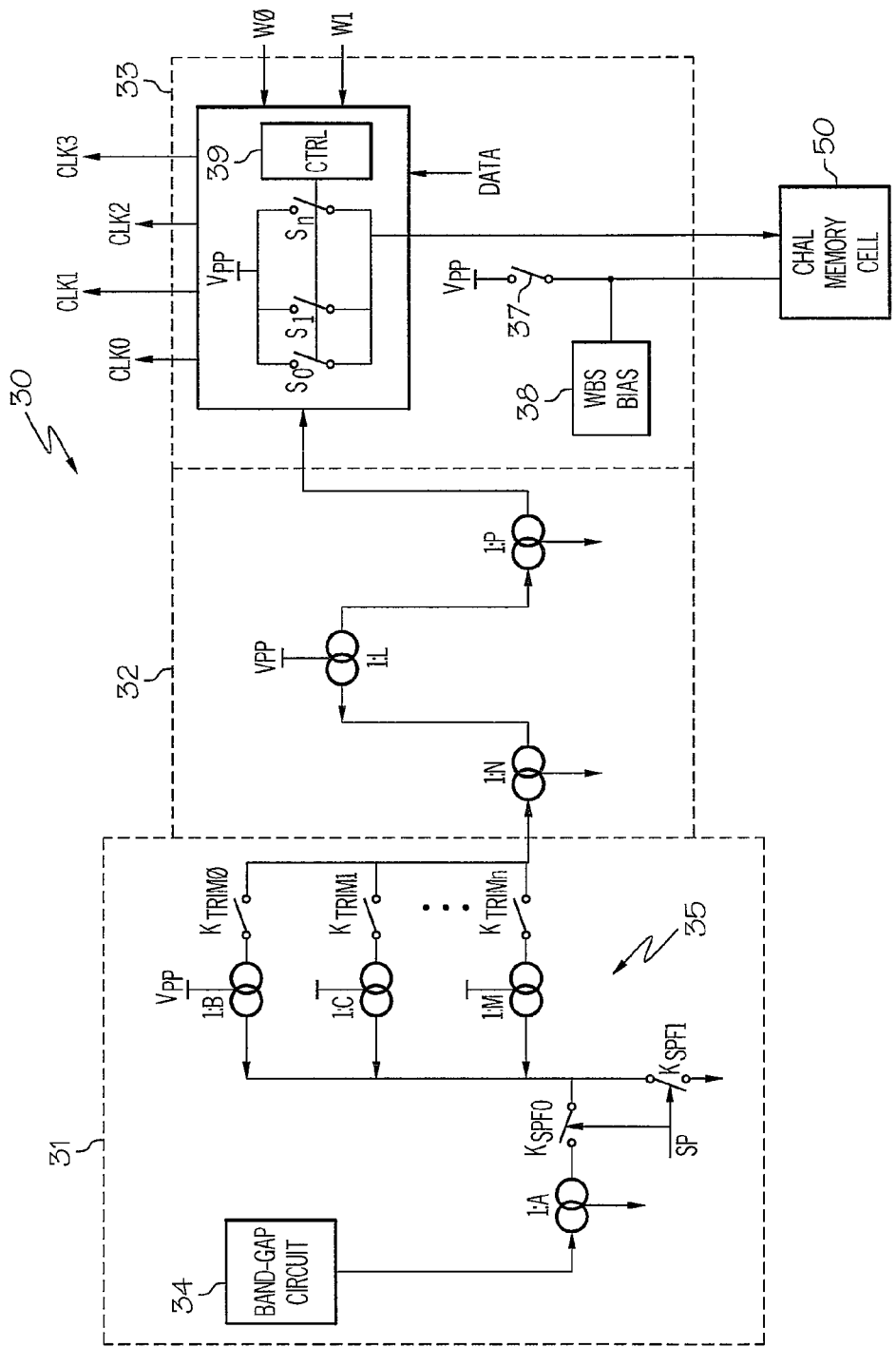
FIG. 3 is a block diagram of a write circuit, in accordance with a preferred embodiment of the present invention.

Frequency divider 23 also divides the output signals of programmable ring oscillator 22 into several distinct clock signals, for example, CLK 0-CLK 3, to be sent to a pulse shaping circuit within the write circuit shown in FIG. 3. The pulse shaping circuit then utilizes the clock signals to control the shape of W1 pulses needed for achieving the low impedance (i.e., crystalline) state in a chalcogenide memory cell during a write "1" operation.

Referring now to FIG. 3, there is depicted a block diagram of a write circuit for providing distinctive write current to chalcogenide memory cells within a chalcogenide memory device, in accordance with a preferred embodiment of the present invention. As shown, a write circuit 30 includes a current amplitude trim module 31, a current amplification and distribution module 32, and a write current shaping module (i.e., write head) 33. Write circuit 30 provides a variety of trim and control options, and the current applied to a chalcogenide memory cell 50 is well compensated with a desired modulation across a specific temperature range.

Current amplitude trim module 31 includes a band-gap circuit 34 and a current trim circuit 35. Currents from band-gap circuit 34 are well-compensated across a wide range of temperatures, voltage supplies and process corners. The current from band-gap circuit 34 is fed to current trim circuit 35.

Current trim circuit 35 includes multiple current mirrors of various ratios such as current mirror 1:A to current mirror 1:M, and multiple switches such as switches $K_{SPF0}$ $K_{SPF1}$ and switches $K_{TRIM0}$ to $K_{TRIMn}$. For the present embodiment, current mirror 1:A is connected to ground while current mirror 1:B to current mirror 1:M are connected to a power supply Vpp, where A-M are integers. The power supply Vpp is different from a standard power supply Vdd.

Current trimming can be achieved by selectively connecting switches $K_{TRIM0}$ to $K_{TRIMn}$ such that different current amplitudes can be sent to current amplification and distribution module 32. By opening switch and closing switch $K_{SPF1}$, a write current having a slightly higher amplitude (as compared to standard write pulses) and a very long trailing edge can be supplied to convert the chalcogenide material and its surrounding volume within chalcogenide memory cell 50 from a hexagonal polycrystalline lattice structure to a face-centered cubic polycrystalline lattice structure. As a result, the chalcogenide material within chalcogenide memory cell 50 is conditioned and the dynamic range of chalcogenide memory cell 50 is improved, Current amplification and distribution module 32 is essentially a write current distribution network composed of multiple current mirrors of different ratios, such as current mirror 1:N, current mirror 1:L and current mirror 1:P. Current mirror 1:L is connected to power supply Vpp, and current mirrors 1:N, 1:P are connected to ground. Current mirrors 1:N, 1:L and 1:P have different amplification abilities, and the overall current amplification meets the requirement of chalcogenide memory cell 50. Cascoded transistors are used in the current mirrors 1:N, 1:L and 1:P in order to achieve better compensation through the distribution network of current amplification and distribution module 32.

Write current shaping module 33 includes a write bit switch (WBS) 37, a WBS bias circuit 38, and a write head circuit 39 having switches $S_0$-$S_n$, along with a related control circuit. Switches $S_0$-$S_n$, which are connected to power supply Vpp, can be shared by an M×N array referred to as a data bit. By controlling the opening and closing of switches $S_0$-$S_n$, the current from current amplification and distribution module 32 is modulated, which allows write current shaping module 33 to supply an appropriate amount of write "0" current or write "1" current (write "1" current has a lower amplitude than write "0" current) to chalcogenide memory cell 50. Cascoded transistors are used in write current shaping module 33 for better compensation.

WBS bias circuit 38 is utilized to keep the column select transistor in saturation to achieve better compensation across a wide range of temperatures, supply voltages and process corners.

Since write head circuit 39 is connected to a separate power supply Vpp, thus even if the Vpp supply is driven to ground, chalcogenide memory device 50 can enter a fail-safe read-only mode in which all write operations are prohibited due to absence of a high current through chalcogenide memory cell 50. The separate power supply Vpp for write head circuit 39 provides write protection that is very desirable for memory devices designed for space and military applications.

As has been described, the present invention provides an adjustable write pulse generator within a chalcogenide memory device.

While the invention has been particularly shown and described with reference to a preferred embodiment, it will be understood by those skilled in the art that various changes in form and detail may be made therein without departing from the spirit and scope of the invention.

What is claimed is:

1. An adjustable write pulse generator comprising:
   a band-gap reference current circuit for generating a well-compensated current over a predetermined range of temperatures needed to program a chalcogenide memory cell;
   a programmable ring oscillator for generating a first set of continuous write "0" and write "1" pulse signals based on said well-compensated current;
   a frequency divider for dividing said first set of continuous write "0" and write "1" pulse signals into a second set of continuous write "0" and write "1" pulse signals; and
   a single pulse generator for converting said second set of continuous write "0" and write "1" pulse signals into a single write "0" pulse signal or a single write "1" pulse signal when programming said chalcogenide memory cell.

2. The adjustable write pulse generator of claim 1, wherein said adjustable write pulse generator further includes a control circuit for controlling the widths of said single write "0" or write "1" pulse signal.

3. The adjustable write pulse generator of claim 1, wherein said control circuit allows said single write "0" pulse signal to have two different pulse widths and said single write "1" pulse signal to have four different pulse widths.

4. The adjustable write pulse generator of claim 1, wherein said frequency divider further generates a plurality of clock signals for shaping said write "1" pulse signal at a write head.

5. The adjustable write pulse generator of claim 1, wherein an output clock of said programmable ring oscillator is adjustable according to a specific process technology of said chalcogenide memory cell.

* * * * *